(12) United States Patent
Ahn et al.

(10) Patent No.: US 6,344,377 B2
(45) Date of Patent: Feb. 5, 2002

(54) LIQUID CRYSTAL DISPLAY AND METHOD OF MANUFACTURING THE SAME

(75) Inventors: Byung Chul Ahn, Kyungsangbook-do; Hyung Sik Seo; Hoe Sup Soh, both of Kyunggi-do; Chang Dong Kim, Seoul; Jae Beom Choi, Daejeon-shi; Duk Chul Yun, Seoul, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/880,829

(22) Filed: Jun. 15, 2001

Related U.S. Application Data (60) Division of application No. 09/079,896, filed on May 15, 1998, now Pat. No. 6,259,119, which is a continuation-in-part of application No. 08/993,195, filed on Dec. 18, 1997, now Pat. No. 6,288,414.

(51) Int. Cl.⁷ ............................................. H01L 21/84
(52) U.S. Cl. ..................... 438/158; 438/637; 438/656; 438/669
(58) Field of Search .......................... 438/30, 151, 158, 438/637, 669, 670, 738, 740, 656, 688

(56) References Cited

U.S. PATENT DOCUMENTS

| | | | | |
|---|---|---|---|---|
| 5,824,572 A | * | 10/1998 | Fukui et al. | 438/158 |
| 5,874,326 A | * | 2/1999 | Lyu | 438/158 |
| 6,261,880 B1 | * | 7/2001 | Wu | 438/159 |

* cited by examiner

*Primary Examiner*—T. N. Quach
(74) *Attorney, Agent, or Firm*—Long Aldridge & Norman LLP

(57) ABSTRACT

A semiconductor device includes a substrate and a first layer of a first conductive material on the substrate, the first layer having a first etching rate. A second layer of a second conductive material has a first hole on a portion of the first layer, the second layer having a second etching rate higher than the first etching rate. A third layer includes a combination of the first and second layers between the first and the second layers, the third layer having a third etching rate lower than the second etching rate. An insulating layer has a second hole on the third layer, the insulating layer having a fourth etching rate higher than the first etching rate. A transparent conductive layer is on the third layer through the first and second holes.

18 Claims, 9 Drawing Sheets

LIQUID CRYSTAL DISPLAY AND METHOD OF MANUFACTURING THE SAME

This application is a division of application Ser. No. 09/079,896 filed on May 15, 1998, U.S. Pat. No. 6,259,119, which is a continuation-in-part of U.S. application Ser. No. 08/993,195 filed on Dec. 18, 1997, U.S. Pat. No. 6,288,414 entitled "LIQUID CRYSTAL DISPLAY AND METHOD OF MANUFACTURING THE SAME" by Byung Chul AHN, which is hereby incorporated by reference.

BACKGROUND OF THE INVENTION

1. Field of the Invention

The present invention relates to a method for manufacturing a pad terminal for inputting or outputting electrical signals. More particularly, the present invention relates to a structure of the pad terminal in an electrical circuit board or a liquid crystal display device, and a method of manufacturing of the pad terminal.

2. Discussion of the Related Art

Generally, most electrical circuit boards have pad terminals for inputting or outputting electrical signals. These pad terminals are usually made simultaneously with the rest of the circuit board. Also, an LCD display comprising thin film transistors (TFT's) or other electrical elements has pad terminals similar to ordinary electric circuit boards. The LCD comprises a color filter panel for representing the color of a picture, and an active panel driving a pixel array by applying a data signal corresponding to the picture. These two panels are joined to each other with a narrow gap in between, and a liquid crystal material is injected into the gap. When driving signals are applied to the pad terminals of the active panel, the TFT's of the active panel drive the liquid crystal, thus displaying an image.

The color filter panel comprises a red color filter, a green color filter, and a blue color filter which are arrayed in sequence. A black matrix is located between the color filters in a mesh pattern. A common electrode is formed on the black matrix. The active panel comprises pixel electrodes at the pixels arrayed on the transparent substrate in a matrix pattern. A scan line is formed along the horizontal direction of the pixel array, and a data line is formed along the vertical direction of the pixel array. At one corner of the pixel, a thin film transistor is formed for driving the pixel electrode. The gate electrode is connected to the scan line (sometimes referred to as a 'gate line'), and the source electrode is connected to the data line (sometimes referred to as a 'source line'). A pad terminal is formed at the end portion of each line.

The scan signal and the data signal are applied to the active panel through the pad terminals. The scan signal is used for selecting the horizontal scan line and has a frequency from 30 Hz to 60 Hz. The data signal normally represents an image. By selecting one scan line using the scan signal, the data signal of the scan line can be displayed an the LCD panel.

The signal applied to the pad terminal is an electrical signal. If there are particles or contaminants between the pad terminal and the output terminal of the outer device, or if the electrical contact between them is poor, then the quality of the image on the LCD screen may degrade. Therefore, the process of forming a pad terminal is very important for maintaining the quality of the image. The conventional method for manufacturing the pad terminal and the structure of the LCD will now be described.

Figure 1:
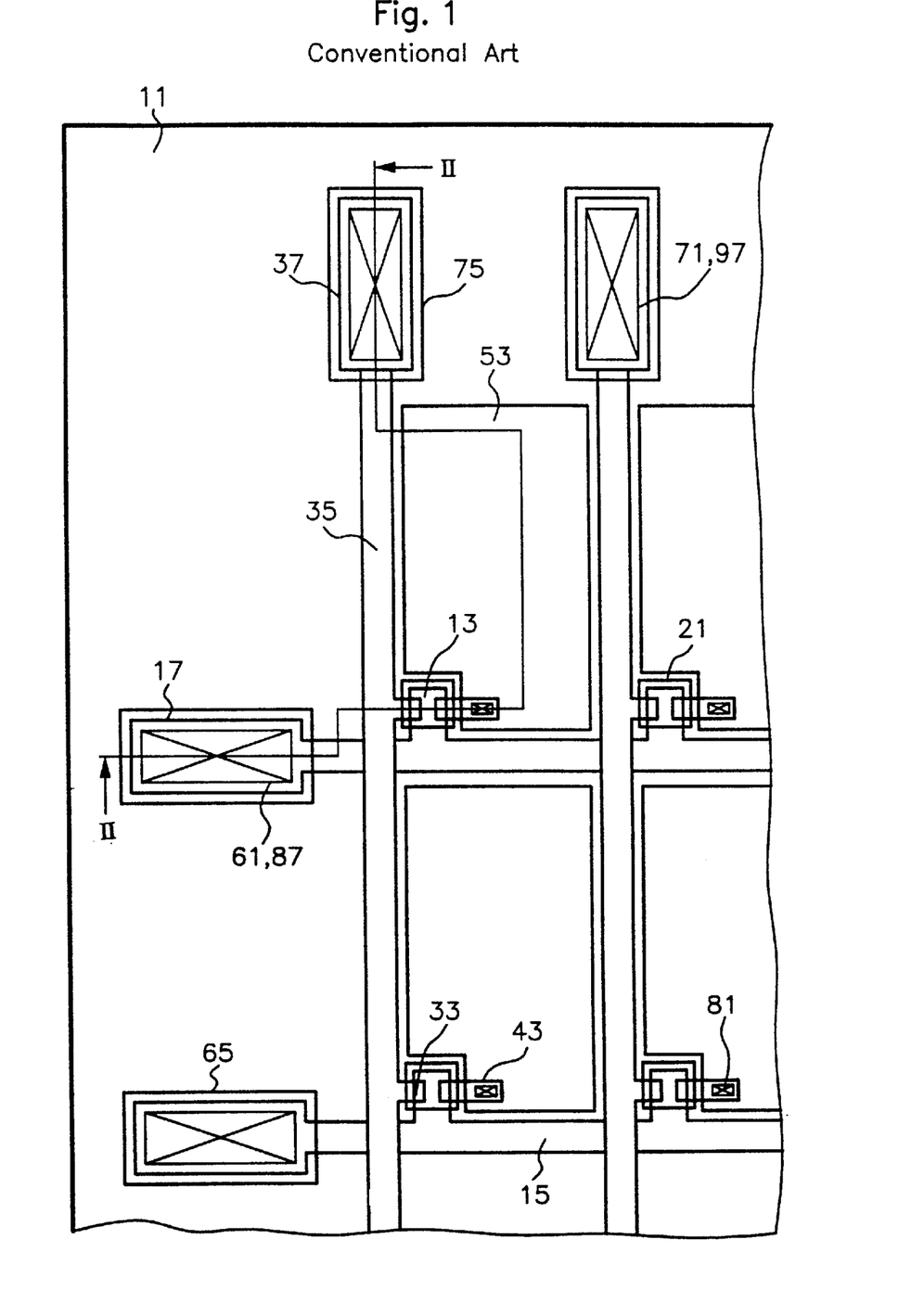
FIG. 1 shows a plan view of the conventional structure of a liquid crystal display device.

FIG. 1 shows a plan view of the conventional structure of an LCD. FIGS. 2a–2f are cross-sectional views showing the conventional process for manufacturing the TFT, the gate line, and the gate pad of an LCD along the line II—II.

Figure 2A:
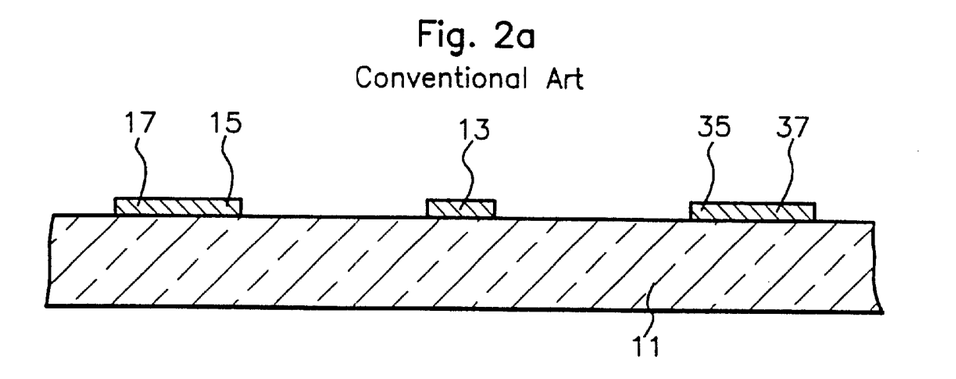
FIGS. 2a–2f are cross-sectional views showing the manufacturing process of a conventional active panel of an LCD.

A metal layer having low resistance such as aluminum or an aluminum alloy is deposited on a transparent substrate 11. A gate electrode 13, a gate line 15, a gate pad 17, and a source pad 37 are formed by patterning the metal layer using a photolithographic method, as shown in FIG. 2a. The gate electrode 13 is formed at one corner of the pixel. The gate line 15 connects the gate electrodes 13 arrayed in a row direction. The gate pad 17 is formed later at an end portion of the gate line 15. The source pad 37 is formed at an end portion of a source line 35.

Figure 2B:
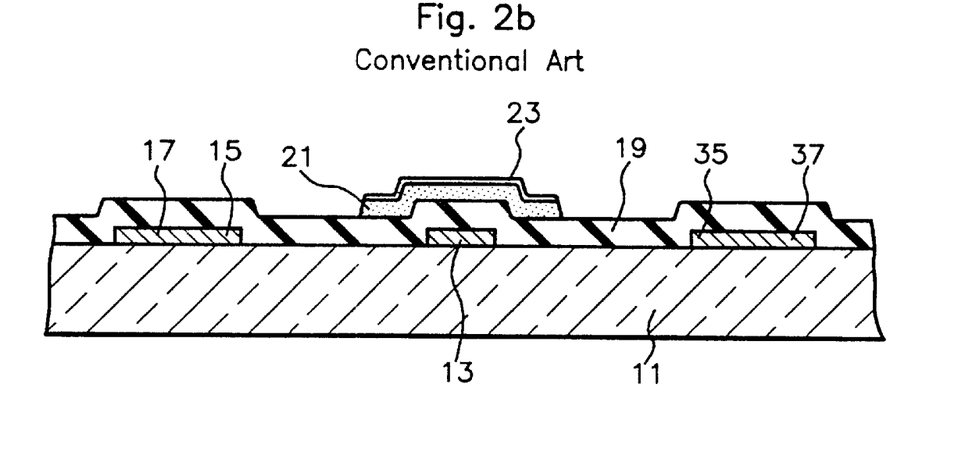

A gate insulation layer 19 is formed by depositing an insulation material such as silicon nitride or silicon oxide on the substrate having the gate electrode 13, the gate line 15, and the gate pad 17. An intrinsic semiconductor material and a doped semiconductor material are sequentially deposited on the gate insulation layer 19. By patterning them, a semiconductor layer 21 and a doped semiconductor layer 23 are formed, as shown in FIG. 2b.

Figure 2C:
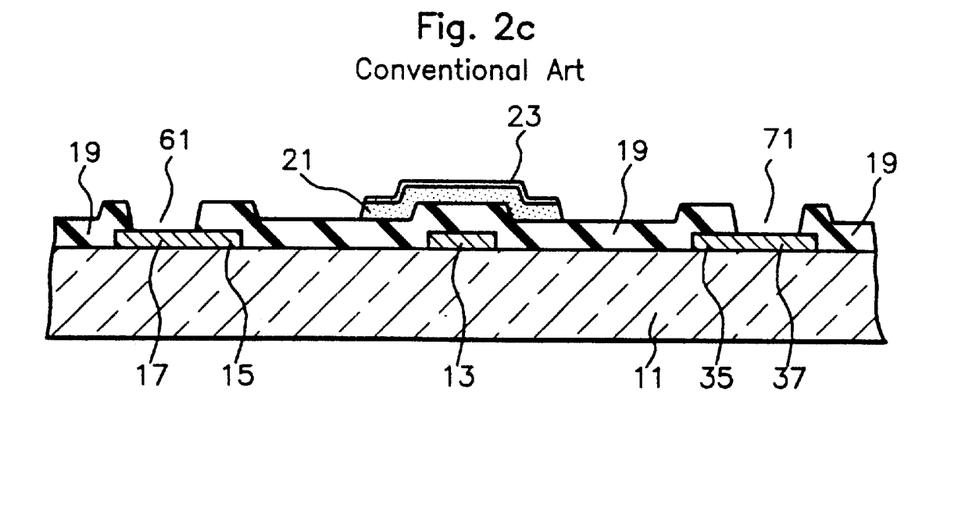

A first gate pad contact hole 61 and a first source pad contact hole 71 are formed by patterning the gate insulation layer 19, as shown in FIG. 2c. The first gate pad contact hole 61 exposes the gate pad 17 by etching the gate insulation layer 19 covering the gate pad 17. The first source pad contact hole 71 exposes the source pad 37 by etching the gate insulation layer 19 covering the source pad 37.

Figure 2D:
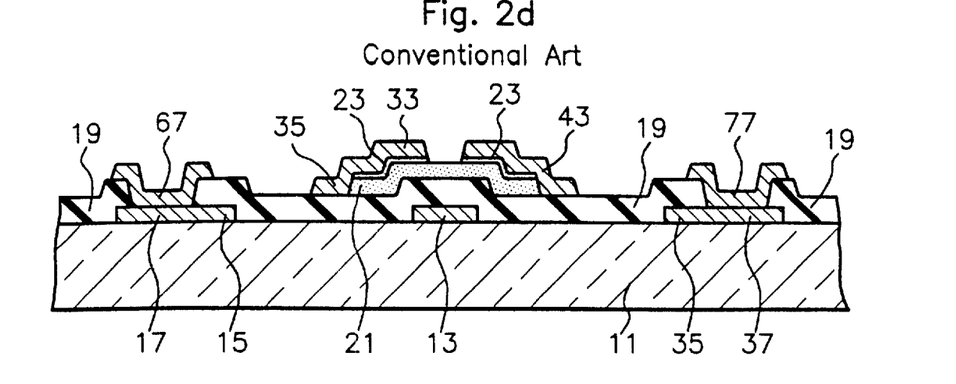

A metal such as chromium or a chromium alloy is deposited on the substrate having the doped semiconductor layer 23. A source electrode 33, a drain electrode 43, a source pad intermediate electrode 77, and a gate pad intermediate electrode 67 are formed by patterning the metal layer, as shown in FIG. 2d. The source electrode 33 contacts one side of the semiconductor layer 21 and the doped semiconductor layer 23, which acts as a source region. The source line 35 connects to the source electrodes 33 arrayed in a column direction. The drain electrode 43 is on the other side of the doped semiconductor layer 23 from the source electrode 33, and connects to the other side of the semiconductor layer 21 and the doped semiconductor layer 23, which acts as a drain region. The source pad intermediate electrode 77 is formed at the end of the source line 35 and connects to the source pad 37 through the first source pad contact hole 71. The gate pad intermediate electrode 67 connects to the gate pad 17 through the first gate pad contact hole 61.

Figure 2E:
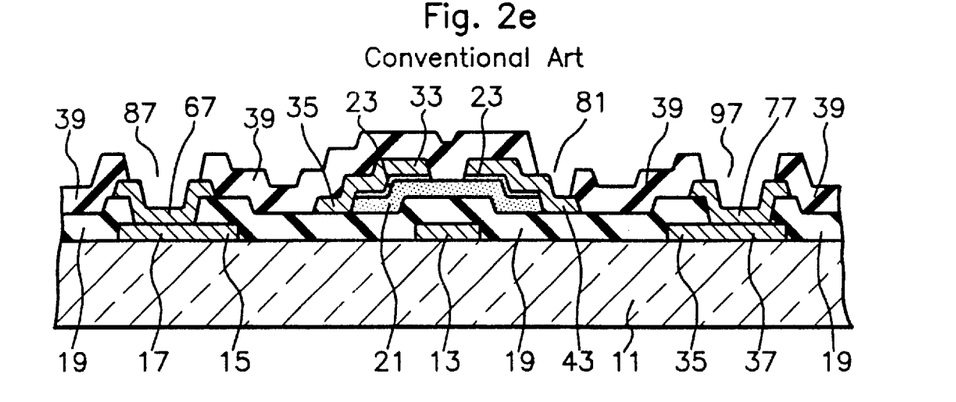

A protection layer 39 is formed by depositing an insulation material such as silicon oxide or silicon nitride on the substrate having the source electrode 33. A drain contact hole 81, a second gate pad contact hole 87, and a second source pad contact hole 97 are formed by patterning the protection layer 39, as shown in FIG. 2e. The drain contact hole 81 exposes the drain electrode 43 by removing a portion of the protection layer 39 covering the drain electrode 43. The second gate pad contact hole 87 exposes the gate pad intermediate electrode 67 by removing a portion of the protection layer 39 covering the gate intermediate electrode 67. The source pad contact hole exposes the source intermediate electrode 77 by removing a portion of the protection layer 39 covering the source intermediate electrode 77.

Figure 2F:
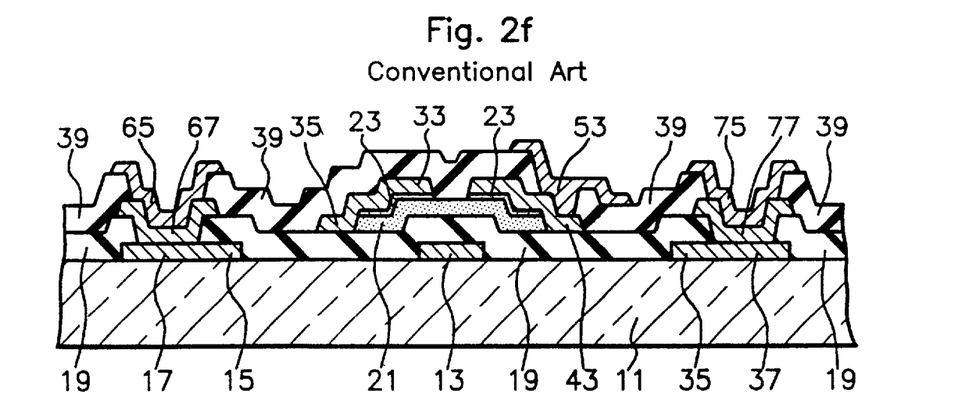

A pixel electrode 53, a gate pad terminal 65, and a source pad terminal 75 are formed by depositing and patterning indium tin oxide (ITO) on the protection layer 39, as shown in FIG. 2f. The pixel electrode 53 connects to the drain electrode 43 through the drain contact hole 81. The gate pad terminal 65 connects to the gate pad intermediate terminal 67 through the second gate pad contact hole 87. The source pad terminal 75 connects to the source pad intermediate electrode 77 through the second source pad contact hole 97.

According to the conventional method, the gate pad 17 and the source pad 37 comprise aluminum, the gate and source pad intermediate electrodes 67 and 77 comprise chromium, and the gate source pad terminals 65 and 75 comprise ITO. Generally, when ITO is deposited by a sputtering method on the intermediate electrodes 67 and 77, it is sputtered in an oxygen atmosphere. At that time, chromium oxide can form on the surface of the intermediate electrodes 67 and 77. Also, the gate insulation layer or the protection layer comprising the silicon oxide or silicon nitride are formed on the pads or on the intermediate electrodes and patterned to form contact holes. When silicon oxide or silicon nitride is deposited on the surface of the metal layer, a thin metal oxide layer or a thin metal nitride layer can form, resulting in a contact resistance between chromium and ITO that is higher than desired.

SUMMARY OF THE INVENTION

Accordingly, the present invention is directed to a liquid crystal display and method of manufacturing the same that substantially obviates one or more of the problems due to the limitations and disadvantages of the related art.

One object of the present invention is to keep contact resistance of a pad terminal surface of an active panel at a low level.

Another object of the present invention is to maintain the scan and data signals in their original state by keeping contact resistance of the pad terminal at a low level.

Another object of the present invention is to enhance the quality of a displayed image by maintaining the signals of the active panel in their original state.

A further object of the present invention is to provide a hillock-free gate structure.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these an other advantages, and in accordance with the purpose of the present invention, as embodied and broadly described, in a first aspect of the present invention there is provided a method for manufacturing a semiconductor device comprises the steps of forming a first layer of a first conductive material on a substrate; forming a second layer of a second conductive material on the first layer; etching the first and the second layer simultaneously to form a pad; forming an insulating layer on the pad and the substrate; and etching the insulating layer and the second layer simultaneously.

In another aspect of the present invention, a method for manufacturing a semiconductor device comprises the steps of forming a first layer of a first conductive material on a substrate, the first layer having a first etching rate; forming a second layer of a second conductive material on the first layer, the second layer having a second etching rate, the second etching rate of the second layer being higher than the first etching rate of the first layer; forming a third layer between the first and second layers, the third layer including a combination of the first and second layers, the third layer having a third etching rate lower than the second etching rate of the second layer; etching the first and the second layer simultaneously to form a pad; forming an insulating layer having a fourth etching rate on the pad and the substrate, the fourth etching rate being higher than the first etching rate of the first layer; and etching the insulating layer and the second layer simultaneously using a single mask to expose a portion of the third layer.

In another aspect of the present invention, a semiconductor device comprises a substrate; a first layer of a first conductive material on the substrate; a second layer of a second conductive material having a first hole on a portion of the first layer; a third layer of conductive material between the first and the second layers; an insulating layer having a second hole on the third layer; and a transparent conductive layer on the third layer through the first and second holes.

In a further aspect of the present invention, a semiconductor device comprises a substrate; a first layer of a first conductive material on the substrate, the first layer having a first etching rate; a second-layer of a second conductive material having a first hole on a portion of the first layer, the second layer having a second etching rate higher than the first etching rate; a third layer including a combination of the first and second layers between the first and the second layers, the third layer having a third etching rate lower than the second etching rate; an insulating layer having a second hole on the third layer, the insulating layer having a fourth etching rate higher than the first etching rate; and a transparent conductive layer on the third layer through the first and second holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The present invention relates to a method for maintaining contact resistance of a pad and the structure of the pad. The present invention prevents contamination by foreign materials, such as an oxidation layer or a nitrification layer, of the pad surface during the manufacture of an LCD active panel. Thus, contact resistance does not increase due to the contaminating materials. Also, the pad surface may have a raised part and a depressed part, enlarging the total contact area of the pad. Therefore, contact resistance and adhesion between the pad and the pad terminal are improved. Thus, a high quality LCD panel can be manufactured.

The present invention therefore discloses a manufacturing method of an active panel where the pad terminal surface does not have a thin layer of particles which increase contact resistance. According to the present invention, the manufacturing method includes a step of forming a pad by depositing and patterning a first and a second metal layer on a substrate; forming a pad protection layer by depositing silicon oxide or silicon nitride on the pad; forming a pad contact hole by patterning the pad protection layer by using a dry etching method; removing by wet etching an exposed portion of the second metal layer through the pad contact hole; forming a pad terminal in contact with the pad through the pad contact hole by depositing and patterning an indium tin oxide layer on the pad protection layer. Therefore, the surface of the pad including the first metal does not have an oxide or a nitride layer. If a thin layer of oxide or nitride layer is formed on the second metal layer, then it is removed at the step of wet etchings the second metal layer. So, the contact between the ITO and the pad remains satisfactory after removing the photoresist pattern to expose the surface on the gate electrode.

Figure 3:
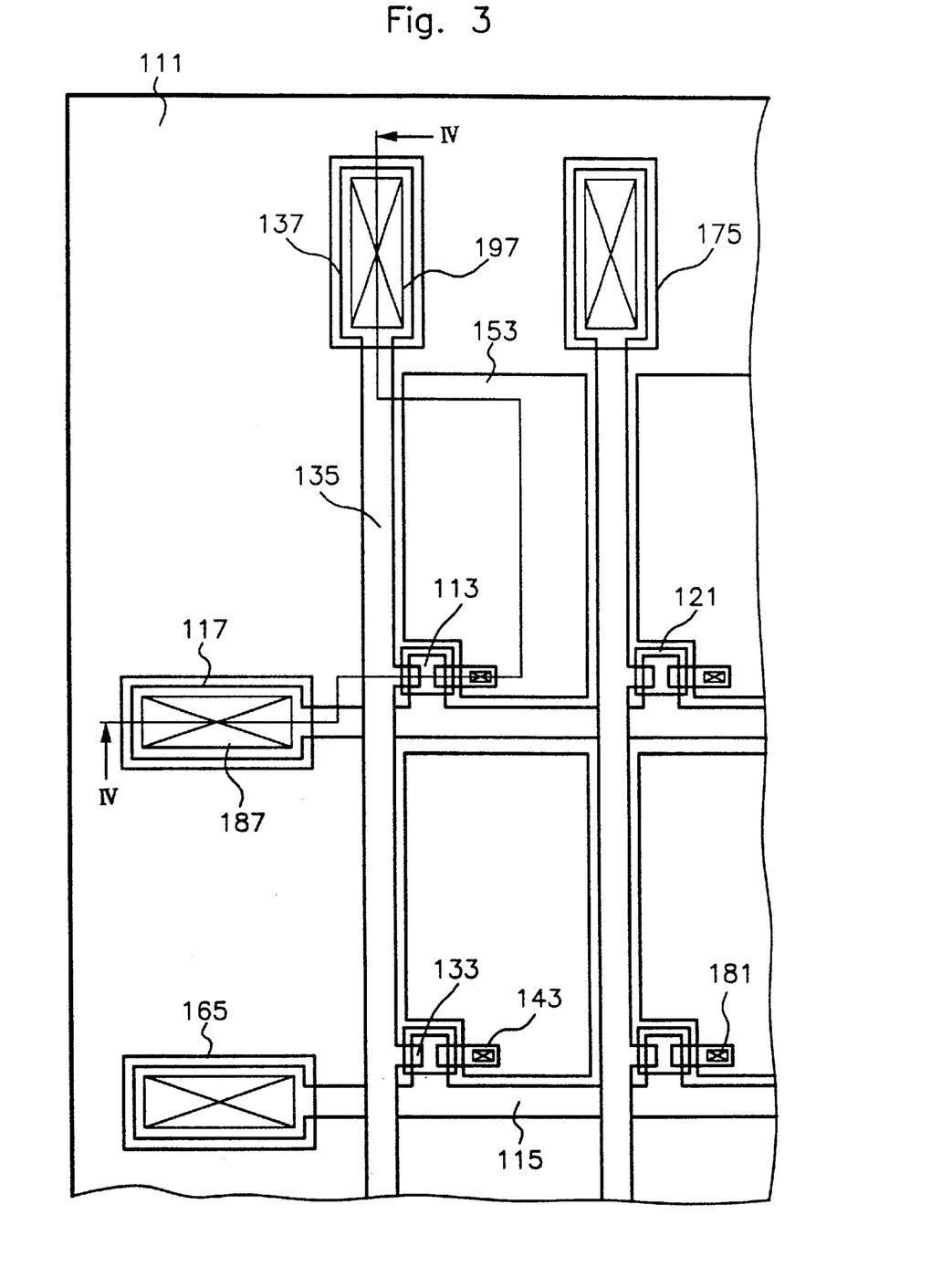
FIG. 3 shows a plan view of a structure of an LCD of the present invention.

Referring to FIG. 3 showing a plan view of an active panel of the present invention and FIGS. 4a–4f showing cross-sectional views of the active panel along the line IV—IV in FIG. 3, this embodiment will now be described.

Figure 4A:
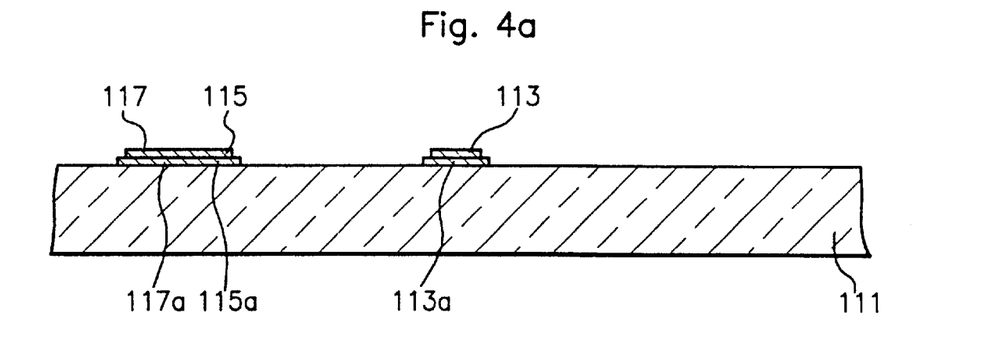
FIGS. 4a–4e are cross-sectional views showing an example of a manufacturing process of an active panel of the present invention.

A first metal layer including aluminum is deposited on a transparent substrate 111 to form an aluminum layer. The aluminum layer is patterned to form a low resistance gate electrode 113a, a low resistance gate line 115a, and a low resistance gate pad 117a, as shown in FIG. 4a.

A second metal layer including preferably molybdenum or chromium is deposited on the substrate 111, the low resistance gate electrode 113a, the low resistance gate line 115a, and the low resistance gate pad 117a. The second metal layer is patterned to form a second-metal gate electrode 113, a second-metal gate line 115, and a second-metal gate pad 117, as shown in FIG. 4a. The second-metal gate electrode 113 is formed at one corner of a pixel. The second-metal gate line 115 connects the second-metal gate electrodes 113 arrayed in a row direction. The second-metal gate pad 117 is located at the end portion of the second-metal gate line 115. The second-metal gate electrode 113, the second-metal gate line 115, and the second-metal gate pad 117 cover portions of the low resistance gate electrode 113a, the low resistance gate line 115a and the low resistance gate pad 117a, respectively. Here, the covered portion of the aluminum metal layer is defined such that the hillock problem does not occur.

Figure 4B:
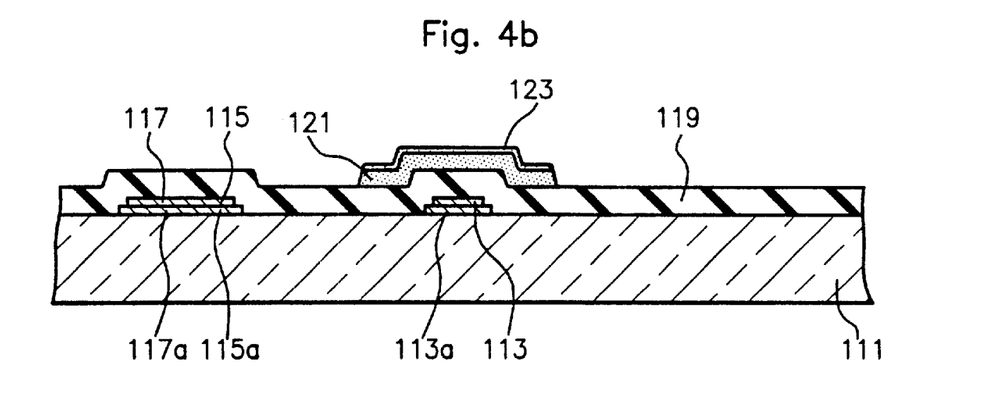

An insulation material such as silicon oxide or silicon nitride is deposited on the substrate 111, the second-metal gate electrode 113, the second-metal gate line 115, and the second-metal gate pad 117. The layer including the insulation material becomes a gate insulation layer 119. An intrinsic semiconductor material and a doped semiconductor material are sequentially deposited thereon. The the intrinsic semiconductor material and the doped semiconductor material are patterned to form a semiconductor layer 121 and a doped semiconductor layer 123, respectively, as shown in FIG. 4b.

Figure 4C:
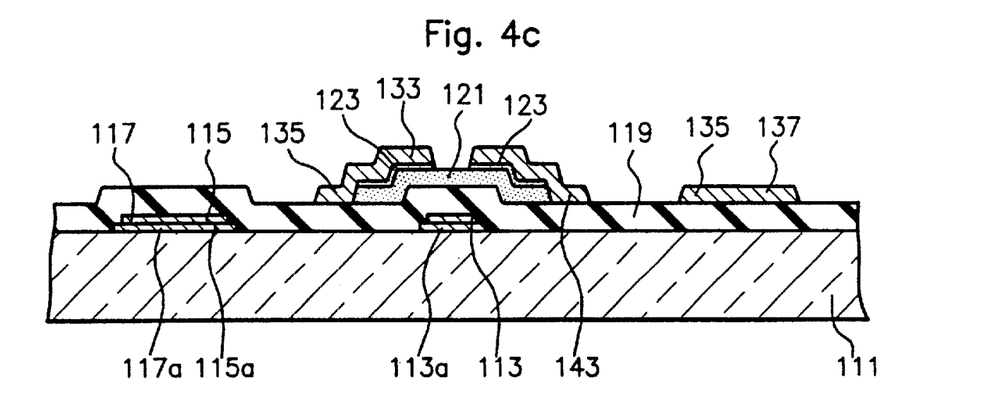

A third metal layer including molybdenum or chromium is deposited on the substrate, 111, the semiconductor layer 121 and the doped semiconductor layer 123. The third metal layer is patterned to form a source electrode 133, a source line 135, a source pad 137, and a drain electrode 143. The source electrode 133 is formed in contact with a source region of the TFT, and the drain electrode 143 is formed in contact with a drain region of the TFT. The source electrode 133 and the drain electrode 143 are separated by a gap in the doped semiconductor layer 123. The exposed part of the doped semiconductor layer 123 between the source electrode 133 and the drain electrode 143 is removed by etching, using the source electrode 133 and the drain electrode 143 as a mask so the doped semiconductor layer 123 is divided into two parts, as shown in FIG. 4c. The source line 135 connects the source electrodes 133 arrayed in a column direction. The source pad 137 is located at an end portion of the source line 135.

Figure 4D:
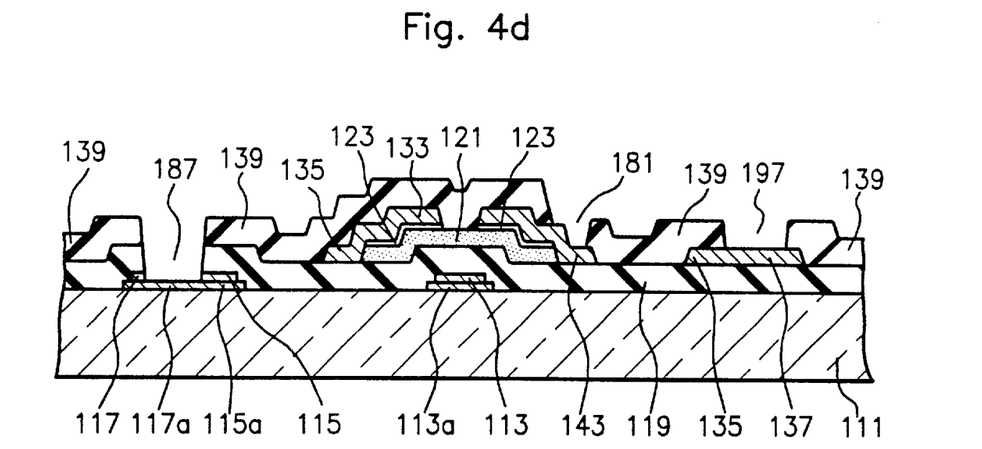

A protection layer 139 is formed by depositing an insulation material such as silicon nitride or silicon oxide on the substrate 111, the source electrode 133, the source line 135, the source pad 137, and drain electrode 143. The protection layer 139 is patterned to form a drain contact hole 181, a gate pad contact hole 187, and a source pad contact hole 197, as shown in FIG. 4d. The drain contact hole 181 exposes the drain electrode 143 by etching the protection layer 139 covering the drain electrode 143. The gate pad contact hole 187 exposes the second-metal gate pad 117 by removing the protection layer 139 and the gate insulation layer 119 covering the second-metal gate pad 117. The source pad contact hole 197 exposes the source pad 137 by etching the protection layer 139 covering the source pad 137. When the gate pad contact hole 187 is formed, the source pad contact hole 197 may also be formed by removing the protection layer 139 covering the source pad 137. Then, the exposed part of the second-metal gate pad 117 is removed by an etching method using the gate pad contact hole 187 as a mask, as shown in FIG. 4d.

Figure 4E:
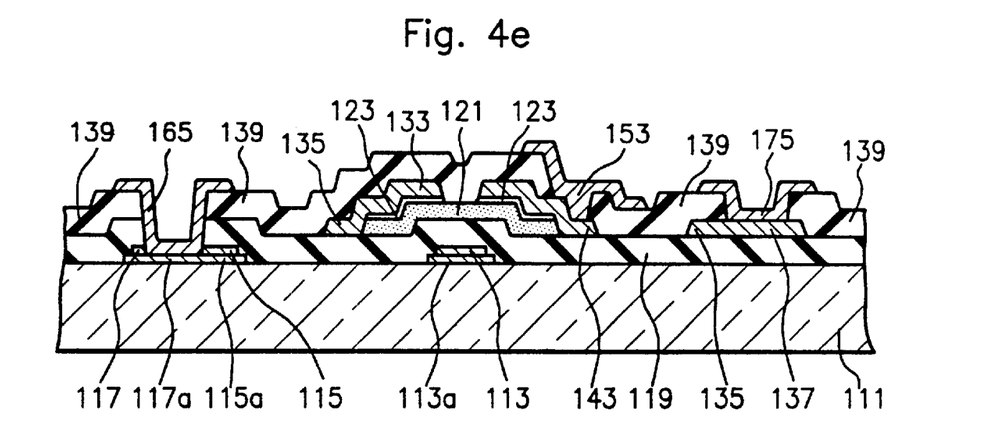

An indium tin oxide layer is deposited on the protection layer 139, and is patterned to form a pixel electrode 153, a gate pad terminal 165, and a source pad terminal 175. The pixel electrode 153 connects to the drain electrode 143 through the drain contact hole 181. The gate pad terminal 165 is connected to the low resistance gate pad 117a through the gate pad contact hole 187. The source pad terminal 175 is connected to the source pad 137 through the source pad contact hole 197, as shown in FIG. 4e.

According to this embodiment, the low resistance gate pad 117a includes a first metal layer including aluminum, and the second-metal gate pad 117 includes a first metal layer including aluminum and a second metal layer including chromium or molybdenum. The second metal layer may cover the first metal layer entirely. So, the hillock problem which occurs on an aluminum surface is prevented by the second metal layer.

A portion of the second-metal gate pad 117 exposed through the gate pad contact hole 187 is removed by a wet etching method. The gate pad terminal 165 is formed by depositing an ITO layer over it, and patterning the ITO layer. Therefore, the exposed surface of the second-metal gate pad 117 is clear, and there are no contaminants such as molybdenum oxide, molybdenum nitride, chromium oxide, or chromium nitride between the second-metal gate pad 117 and the gate pad terminal 165.

The embodiment describes another example of a pad structure of an LCD and the manufacturing method for the same. According to the above preferred embodiment, the surface of a pad is a plane structure, as shown in FIG. 4e. This embodiment describes a pad structure where contact resistance between the pad and a pad terminal is reduced and the adhesion between them is enhanced.

In order to further improve and prevent the hillock problem on the aluminum surface, for example, an ITO/MoAlx/Al structure was used as the pixel electrode/intermetallic layer/gate, respectively. Although the hillock-free structure of the present invention is discussed with reference to the ITO/MoAlx/Al structure, other suitable materials may be used according to the present invention as discussed below.

The semiconductor device in accordance with the present embodiment includes a semiconductor device having a substrate and a first layer of a first conductive material on the substrate. The first layer preferably includes aluminum. The first layer may also include Cu or Au. A second layer of a second conductive material having a first hole is on a portion of the first layer. The second layer preferably includes molybdenum or an alloy including Mo. The second layer may also act as an etch stop layer. The first and second layers have a step structure. A spacing between an edge of the first layer to an edge of the second layer is preferably about 0.5 to 2 $\mu$m. The first layer is preferably made of a material exhibiting a tensile stress and the second layer is made of a material exhibiting a compressive stress.

A third layer of conductive material is between the first and the second layers. The third layer preferably includes a combination of the first and the second layers of conductive material such as MoAlx. The third layer has an etching rate lower than the etching rate of the second layer. An insulating layer having a second hole is on the third layer. The insulating layer preferably includes a first pad insulating layer and a passivation layer over the first pad insulating layer. The insulating layer and the second layer preferably have etching rates higher than the first layer. The insulating layer and the second layer may have substantially the same etching rate. The insulating layer and the third layer includes multiple holes. A transparent conductive layer is on the third layer through the first and second holes.

EXAMPLE

As low resistive gate lines in thin film transistors (TFTs), the various structures of aluminum (Al) double layers patterned by one photolithography process have been investigated. For the Mo/Al structure, Al hillocks were not shown during and/or after a plasma enhanced chemical vapor depositions (PECVD) process of about 320° C. The stress of Al film is compensated by the compressive molybdenum (Mo) film. Additionally, this Mo layer prevented the surface of Al layers from oxidization during Indium-Tin-Oxide (ITO) pixel electrode deposition and annealing at the pad open regions. As a result, there was no contact problem in the ITO/Mo/Al structure. A 12.1 inch SVGA TFT-LCD was successfully fabricated by a simple process with the present structure as a gate line.

A low electrically resistive gate material, such as Al and its alloy, is needed in larger and higher quality thin film transistor liquid crystal displays (TFT-LCD). However, Al is likely to form hillocks during a high temperature process such as PECVD or annealing process. Many researches have been focused on preventing the Al hillocks, and some structures such as clad or Al/AlTa buffered structure, have been proposed as hillock-free gate structures.

In the clad structure were the Al metal is covered by refractory metals such as Cr, Mo, Ta, and Ti, two separated photolithography and wet etching processes are required to complete the gate bus line. On the other hand, the Al/AlTa buffered structure needs only one photolithography step for the gate bus line by etching the two metals simultaneously. However, this structure has a contact problem at the pad region where the ITO/Al contact is formed because of Al oxidation during ITO deposition and annealing process. The Al oxide layer causes the contact resistance to increase. The present inventors have shown that Al oxide layer is formed after 300° C. annealing processes analyzed by Electron Spectroscopy for Chemical Analysis (ESCA). A diffusion barrier metal can be inserted to prevent the Al oxidation.

The present inventors have investigated Mo/Al and AlTa/Al double layers for hillock-free Al gate metallization and ohmic contact in the pad region [ITO/(Cr, Mo, AlTa)/Al]. The double metals were deposited continuously without breaking the vacuum and patterned by wet etching with only one photolithography process. The internal stress of the double metal layers and the etched profile of the metals were changed to clarify the hillock prevention mechanism.

Al hillocks were found in the Cr/Al and the AlTa/Al double layers but not in the Mo/Al. This result can be explained by the stress balance between the upper refractory metals and the bottom Al. While the Al, AlTa and Cr layers have a tensile stress, the Mo layer has a compressive stress. Therefore, as the processing temperature increases, Al hillocks could be suppressed by stress compensation between Mo and Al layers.

The stress was measured during the heating and cooling process. As the temperature increased up to 160° C., all the materials deformed elastically. Above 160° C., Al and Al/Mo deformed plastically and the hillocks began to form. However, the Mo/Al layer continued to deform elastically. The thermally induced stress was accumulated at the Mo/Al interface due to the stress balance between the two films. As a result, hillocks were prevented because the critical stress for Al diffusion was not applied to the Al film.

In order to investigate the Al side hillock formation, different etch profiles were made in the Mo/Al structure. The side hillocks did not happen in all the samples. According to these results, not only the side of the etched Al but also the Al would be under the stress compensation effects of the upper Mo layer. These results also provide a large tolerance of the etch profiles for a good step-coverage of the gate insulator which could prevent an electrical short between the gate and the data bus line.

The Mo layer at the pad region was not etched off during the dry etching process of a gate insulator. As a result, ITO/Mo/Al contact was successfully formed. The inserted Mo layer prevented the Al oxidation during the ITO deposition and the annealing process by blocking the diffusing oxygen atoms into the Al surface.

Figure 7A:
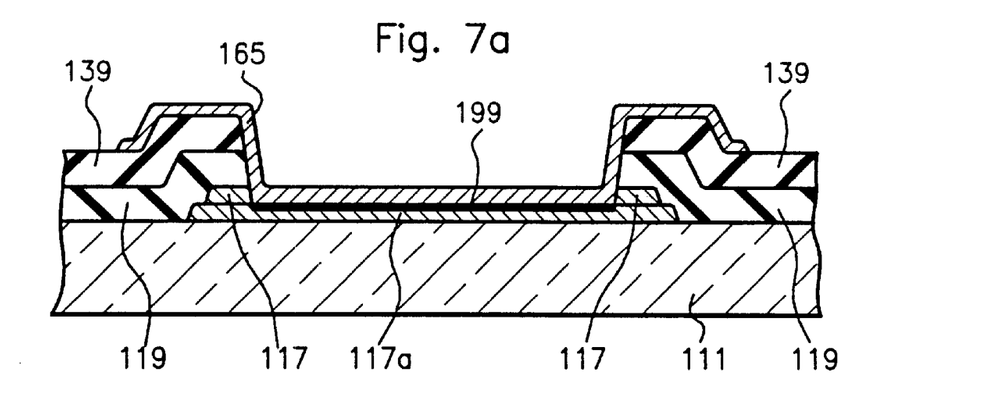
FIGS. 7a–7b are cross-sectional views showing a pad of the present invention.

Alternatively, the inserted Mo layer was etched off during the gate insulator dry etching process as shown in FIG. 7a, for example. There was no contract problem because an MoAlx intermetallic compound was formed at the Al surface.

Figure 5:
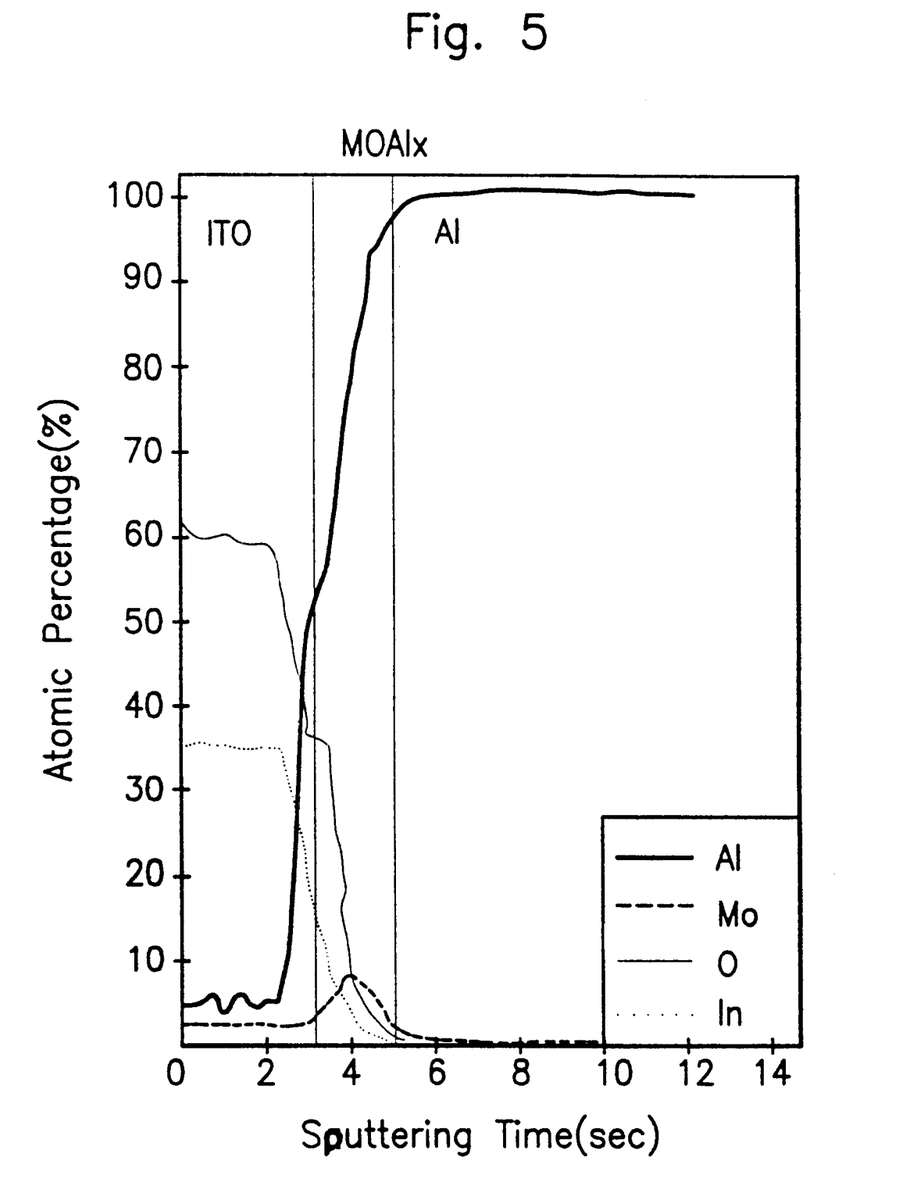
FIGS. 5 shows an analysis using Auger Electron Spectroscopy (AES) of the ohmic contact layer between ITO/AL layers of the present invention.

According to the Augur Electron Spectroscopy (AES) analysis shown in FIG. 5, no $Al_2O_3$ layer was detected between the ITO/MoAl$_x$/Al interface. After the severe SiN$_x$ dry etching process, which does not have the high selectivity between the SiN$_x$ and Mo, MoAl$_x$ layer acted as a diffusion barrier between the ITO and the Al during thermal annealing and ITO deposition processes. The MoAl$_x$ layer may be formed after high temperature PECVD SiN$_x$ deposition.

Using the above, a 12.1" SVGA TFT-LCD was manufactured by a simple process. As an example, the transfer characteristics of a —Si TFT with Mo/Al double layer gate metallization showed that on-current was up to 5.04 $\mu^A$ (V$_g$=20V, V$_d$=10V), off-current was 1.18p$^A$ (V$_g$=–10V~OV) and the mobility was 0.7 cm$^2$/v·sec. There was no gate line delay and no contact problems in the pad open region.

Accordingly, hillock-free Al gate metallization of Mo/Al was investigated and the hillock prevention mechanism was studied. The Al hillocks were prevented by the stress compensation effect of the upper Mo layer during the thermal process. This effect enlarged the process tolerance of a wet etching process of the gate material for a good step coverage.

Additionally, the contact problem between the ITO and the Al layer at the pad region was completely solved by the Mo layer between them. As a diffusion barrier of oxygen, the MoAl$_x$ layer prevented the Al oxide formation between the ITO/Al interface.

Figure 6:
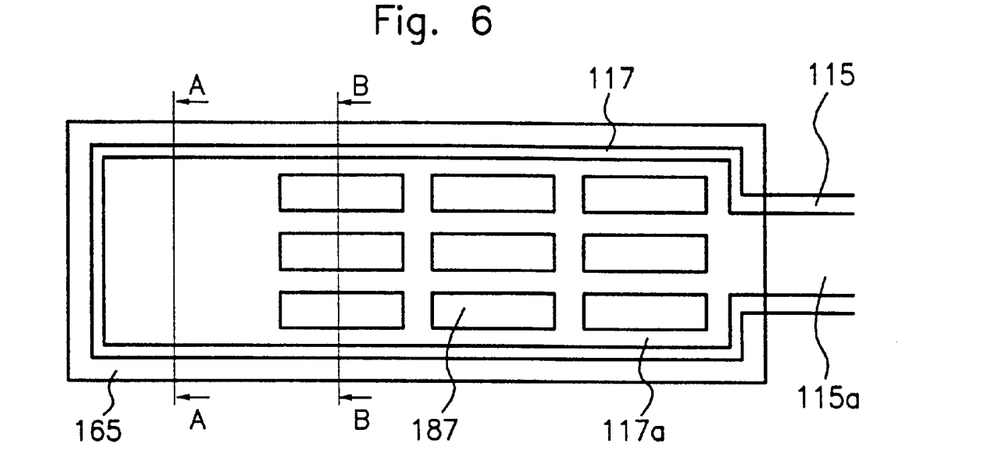
FIG. 6 shows a plan view of a pad of the present invention.
Figure 7B:
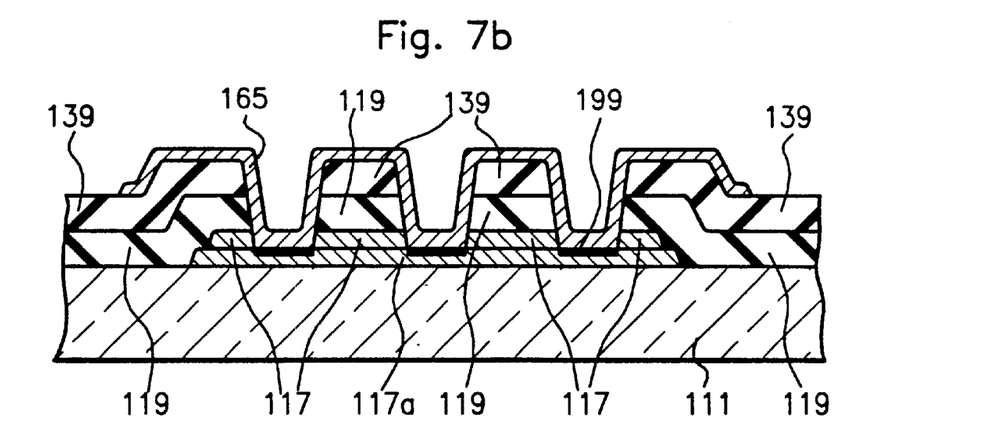

To improve contact resistance in the present invention, the contact area can be enlarged. The surface of the pad has a raised part and a depressed part. In this embodiment, the pad contact hole has many small holes, rather than a single hole, as shown in FIG. 6. FIG. 6 shows a pad structure in which the pad has many small contact holes. FIG. 7a shows a cross-sectional view of a pad having one contact hole, and FIG. 7b shows the cross sectional view of a pad having several small contact holes. As shown in FIGS. 7a and 7b, an intermetallic layer 199 is formed between the low resistance gate pad 117a and a second metal gate pad 117. The intermetallic layer 199 is preferably formed of MoAlx from the Al layer below the Mo layer. MoAlx is formed during the gate insulator dry etching process, for example, which also etches off the portion of the Mo layer 117 corresponding to the MoAlx layer.

The ITO layer, which will become a pad terminal, is usually sputtered in an oxygen atmosphere. Here, a thin aluminum oxide layer will be formed on the exposed pad surface that includes aluminum. Aluminum oxide has high resistance to electrical current. Therefore, the existence of the aluminum oxide layer hinders electrical contact. In this embodiment, the gate pad contact hole 187 includes many small holes and the second-metal gate pad 117 is patterned by an etching method using the small holes as a mask. In spite of the fact that a thin aluminum oxide layer is formed on the exposed low resistance gate pad 117a which includes aluminum, the gate pad terminal 165 is also in contact with side portions of the etched second-metal gate pad 117 which includes molybdenum or chromium. The contact area is enlarged because of the uneven surface shape, and contact resistance between the second-metal gate pad 117 and the gate pad terminal 165 is reduced.

Figure 8A:
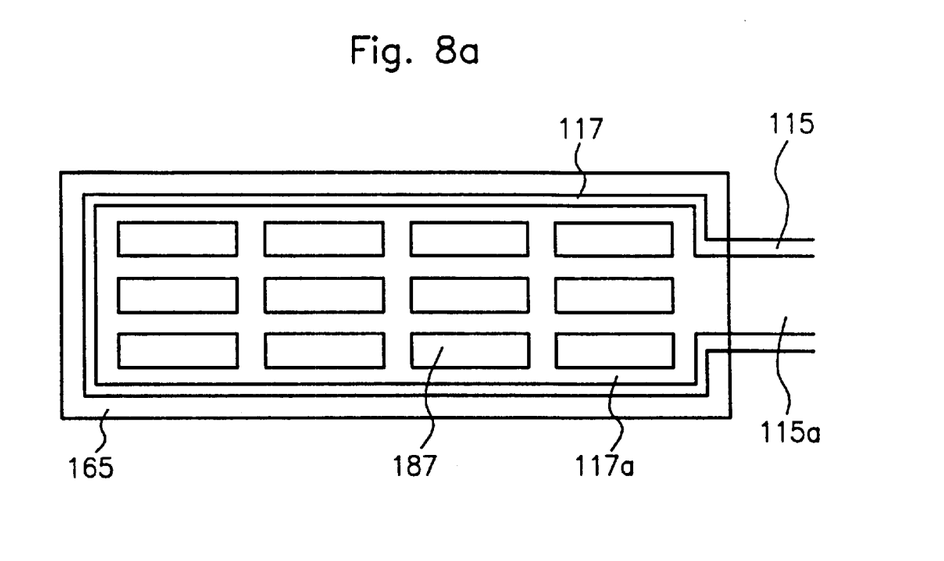
FIGS. 8a–8b show another example of a pad structure of the present invention.
Figure 8B:
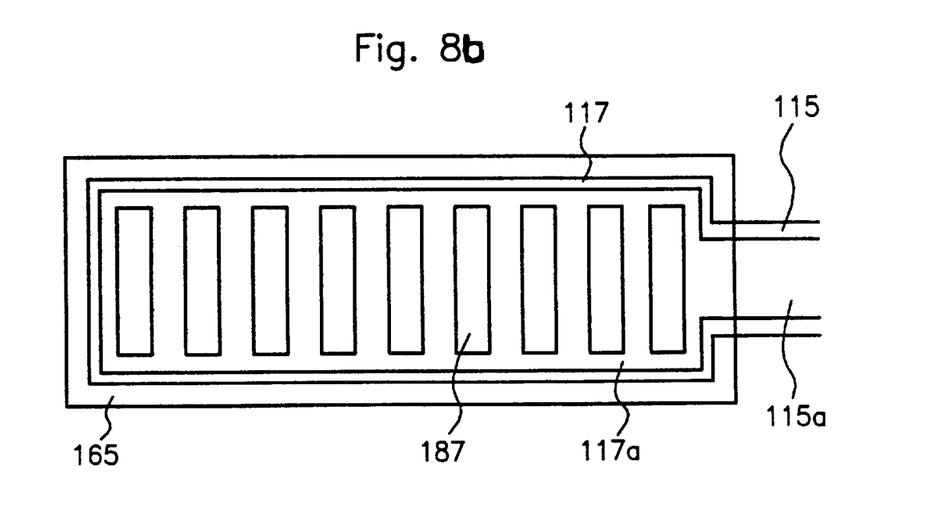

Furthermore, the small holes may have any shape, as shown in FIGS. 8a and 8b. The small holes may be formed over the entire pad part or some part of the pad.

While the invention on has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method for manufacturing a semiconductor device, the method comprising the steps of:

forming a first layer of a first conductive material on a substrate, the first layer having a first etching rate;

forming a second layer of a second conductive material on the first layer, the second layer having a second etching rate, the second etching rate of the second layer being higher than the first etching rate of the first layer;

forming a third layer between the first and second layers, the third layer including a combination of the first and second layers, the third layer having a third etching rate lower than the second etching rate of the second layer;

etching the first and the second layer simultaneously to form a pad;

forming an insulating layer having a fourth etching rate on the pad and the substrate, the fourth etching rate being higher than the first etching rate of the first layer; and etching the insulating layer and the second layer simultaneously using a single mask to expose a portion of the third layer.

2. The method according to claim 1, wherein the first layer includes aluminum.

3. The method according to claim 1, wherein the second layer includes molybdenum.

4. The method according to claim 1, wherein the insulating layer and the second layer have substantially the same etching rate.

5. The method according to claim 1, wherein the insulating layer includes:

a first pad insulating layer; and a passivation layer over the first pad insulating layer.

6. The method according to claim 1, wherein the third layer includes AlMox.

7. The method according to claim 1, wherein the third layer acts as an etch stop layer.

8. The method according to claim 1, wherein the step of etching the insulating layer and the second layer forms multiple holes.

9. The method according to claim 8, wherein the first layer is wider than the second layer by about 1 to 4 um.

10. The method according to claim 1, wherein the second layer has a width smaller than the first layer.

11. The method according to claim 1, wherein the first layer is formed of a material exhibiting a tensile stress and the second layer is formed of a material exhibiting a compressive stress.

12. The method according to claim 1, wherein the first layer includes one of Cu and Au.

13. The method according to claim 1, wherein the second layer includes an alloy including Mo.

14. The method according to claim 1, further comprising a transparent conductive layer over the first layer and contacting a portion of the second layer.

15. The method according to claim 1, wherein the transparent conductive layer includes indium tin oxide.

16. The method according to claim 1, further comprising a transparent conductive layer on the third layer.

17. The method according to claim 1, wherein the step of etching the first and the second layers includes wet etching.

18. The method according to claim 1, wherein the step of etching the insulating layer and the second layer includes dry etching.

* * * * *